(12) United States Patent
Su et al.

(10) Patent No.: US 12,089,512 B2
(45) Date of Patent: Sep. 10, 2024

(54) SEMICONDUCTOR STRUCTURE

(71) Applicant: UNITED MICROELECTRONICS CORP., Hsin-Chu (TW)

(72) Inventors: Shih-Wei Su, Tainan (TW); Da-Jun Lin, Kaohsiung (TW); Chih-Wei Chang, Tainan (TW); Bin-Siang Tsai, Changhua County (TW); Ting-An Chien, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/242,550

(22) Filed: Sep. 6, 2023

(65) Prior Publication Data

US 2023/0413690 A1 Dec. 21, 2023

Related U.S. Application Data

(62) Division of application No. 17/114,438, filed on Dec. 7, 2020, now Pat. No. 11,793,091.

(30) Foreign Application Priority Data

Nov. 5, 2020 (CN) .......................... 202011221313.1

(51) Int. Cl.
*H10N 70/00* (2023.01)
*H10B 63/00* (2023.01)

(52) U.S. Cl.
CPC ........... *H10N 70/063* (2023.02); *H10B 63/00* (2023.02); *H10N 70/028* (2023.02); *H10N 70/041* (2023.02); *H10N 70/841* (2023.02); *H10N 70/8833* (2023.02)

(58) Field of Classification Search
CPC ........................... H10N 70/011; H10N 70/826
See application file for complete search history.

(56) References Cited

U.S. PATENT DOCUMENTS

| 6,939,814 | B2 | 9/2005 | Chan |
| 9,099,647 | B2 | 8/2015 | Liao |
| 10,153,432 | B2 | 12/2018 | Zhu |
| 11,793,091 | B2 * | 10/2023 | Su ........................ H10N 70/041 |
| 2008/0128834 | A1 | 6/2008 | Yang |
| 2022/0140239 | A1 | 5/2022 | Su |

* cited by examiner

*Primary Examiner* — Mark V Prenty
(74) *Attorney, Agent, or Firm* — Winston Hsu

(57) ABSTRACT

The invention provides a semiconductor structure, the semiconductor structure includes a substrate, a resistance random access memory on the substrate, an upper electrode, a lower electrode and a resistance conversion layer between the upper electrode and the lower electrode, and a cap layer covering the outer side of the resistance random access memory, the cap layer has an upper half and a lower half, and the upper half and the lower half contain different stresses.

8 Claims, 3 Drawing Sheets

SEMICONDUCTOR STRUCTURE

CROSS REFERENCE TO RELATED APPLICATIONS

This application is a division of U.S. application Ser. No. 17/114,438, filed on Dec. 7, 2020. The content of the application is incorporated herein by reference.

BACKGROUND OF THE INVENTION

1. Field of the Invention

The invention relates to the field of semiconductors, in particular to a resistive random access memory (RRAM) with capping layers with different stresses.

2. Description of the Prior Art

Resistive random access memory (RRAM) has a simple structure, low operating voltage, high-speed, good endurance, and CMOS process compatibility. RRAM is the most promising alternative to provide a downsized replacement for traditional flash memory. RRAM is finding wide application in devices such as optical disks and non-volatile memory arrays.

An RRAM cell stores data within a layer of material that can be induced to undergo a phase change. The phase change can be induced within all or part of the layer to switch between a high resistance state and a low resistance state. The resistance state can be queried and interpreted as representing either a "0" or a "1". In a typical RRAM cell, the data storage layer includes an amorphous metal oxide. Upon application of a sufficient voltage, a metallic bridge is induced to form across the data storage layer, which results in the low resistance state. The metallic bridge can be disrupted and the high resistance state restored by applying a short high current density pulse that melts or otherwise breaks down all or part of the metallic structure. The data storage layer quickly cools and remains in the high resistance state until the low resistance state is induced again.

SUMMARY OF THE INVENTION

The present invention provides a semiconductor structure, the semiconductor structure includes a substrate, a resistive random access memory (RRAM) located on the substrate, the resistive random access memory comprises an upper electrode, a lower electrode and a resistance conversion layer located between the upper electrode and the lower electrode, and a cap layer covering an outside of the resistance random access memory, wherein the cap layer has an upper half and a lower half, and the upper half and the lower half contain different stresses.

The present invention further provides a method for forming a semiconductor structure, the method includes: providing a substrate, forming a resistance random access memory on the substrate, wherein the resistance random access memory comprises an upper electrode, a lower electrode and a resistance conversion layer between the upper electrode and the lower electrode, and forming a cap layer covering the resistance random access memory, wherein the cap layer has an upper half and a lower half, and the upper half and the lower half contain different stresses.

The present invention is characterized in that before the forming step, ion doping is carried out on the cap layer covered outside the resistance random access memory to form a stress gradient inside the cap layer (that is, the stress gradually changes with different positions), so as to meet the lattice arrangement required by the forming step, reduce the energy required by the subsequent forming step, accelerate the carrier migration rate of the resistance random access memory and improve the quality of the resistance random access memory.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 show schematic diagrams of semiconductor structures fabricated according to the first preferred embodiment of the present invention, wherein:

FIG. 2 is a schematic drawing in a step subsequent to FIG. 1,

FIG. 3 is a schematic drawing in a step subsequent to FIG. 2,

FIG. 4 is a schematic drawing in a step subsequent to FIG. 3, and

FIG. 5 is a schematic drawing in a step subsequent to FIG. 4.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
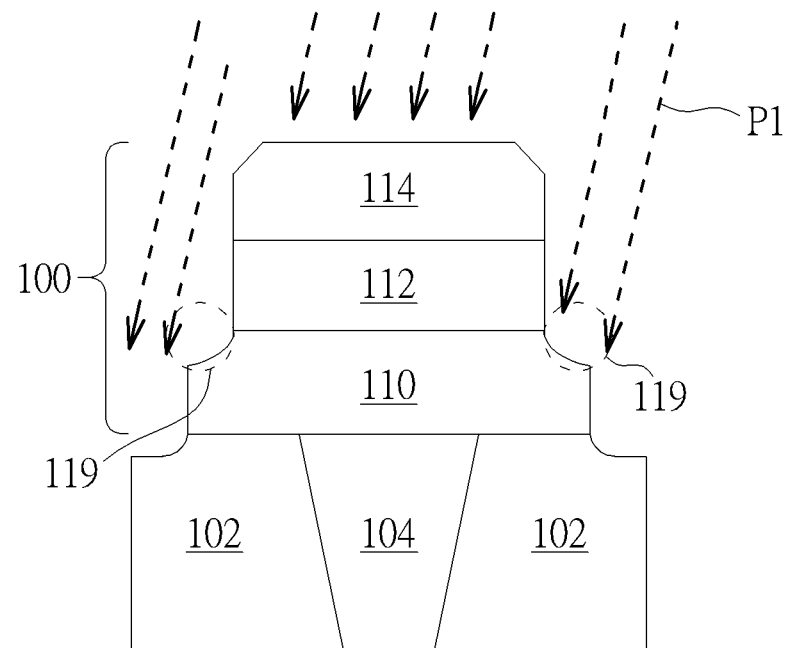

Please refer to FIGS. 1 to 5, which show schematic diagrams of semiconductor structures fabricated according to the first preferred embodiment of the present invention. As shown in FIG. 1, firstly, a resistive random access memory (RRAM) 100 is electrically connected with a contact structure 104. The contact structure 104 may be located in a single layer or a plurality of dielectric layers, and its lower part may be electrically connected with another contact structure or a wire. Taking this embodiment as an example, the contact structure 104 is located in the dielectric layer 102, and there is another wire (not shown) below the contact structure 104, which is electrically connected with the contact structure. The dielectric layer 102 described here is, for example, one of the interlayer dielectric layers (JMD) in a semiconductor structure, and the wire and contact structure 104 is, for example, a wire or a conductive via in the IMD. The material of the dielectric layer 102 may include insulating materials such as silicon oxide, silicon nitride and silicon oxynitride, while the wire and contact structure 104 may include conductive materials such as tungsten, cobalt, copper, aluminum or other conductive materials, and the present invention is not limited thereto.

The resistive random access memory 100 is located on the dielectric layer 102 and electrically connected with the contact structure 104. Generally speaking, the resistance random access memory 100 may at least include a lower electrode 110, a resistance conversion layer 112 and an upper electrode 114. The lower electrode 110 and the upper electrode 114 are made of conductive materials such as titanium, tantalum, titanium nitride, tantalum nitride, etc., and the resistance conversion layer 112 comprises a dielectric material with a dielectric constant greater than 4, such as metallic oxide, hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta2O_9$, SBT), lead zirconate titanate ($PbZrxTi_{1-x}O_3$, PZT), barium strontium titanate ($BaxSr_{1-x}TiO_3$, BST) or a combination thereof.

In addition, except for the above materials, the resistance random access memory 100 may also include more material layers, which is also within the scope of the present invention. Taking one embodiment of the present invention as an example, the resistive random access memory 100 includes a lower electrode (made of TaN), a resistance conversion layer (made of $Ta_2O_5$), a metal layer (made of iridium (Ir)) and an upper electrode (made of TaN) in order from bottom to top. This structure also falls within the scope of the present invention. However, it should be noted that this structure is only one example of the present invention, and the resistive random access memory composed of other materials also belongs to the scope of the present invention.

Then, a partial etching step is performed on the RRAM 100 to remove a part of the RRAM 100 and form a RRAM 100 with a narrow top and a wide bottom profile. More specifically, the partial etching step P1 is, for example, ion beam etching, and the angle of the ion beam etching is adjusted so that more volume of the upper electrode 114 and the resistance conversion layer 112 are removed, while less volume of the lower electrode 110 is removed. Therefore, after the ion beam etching is completed, the width of the upper electrode 114 (W1 labeled in FIG. 1) of the resistance random access memory 100 will be smaller than that of the lower electrode 110 (W2 labeled in FIG. 1). In addition, in some embodiments, the angle of the partial etching step P1 may be adjusted so that a recessed notch 119 is formed between the lower electrode 110 and the resistance conversion layer 112.

Figure 2:
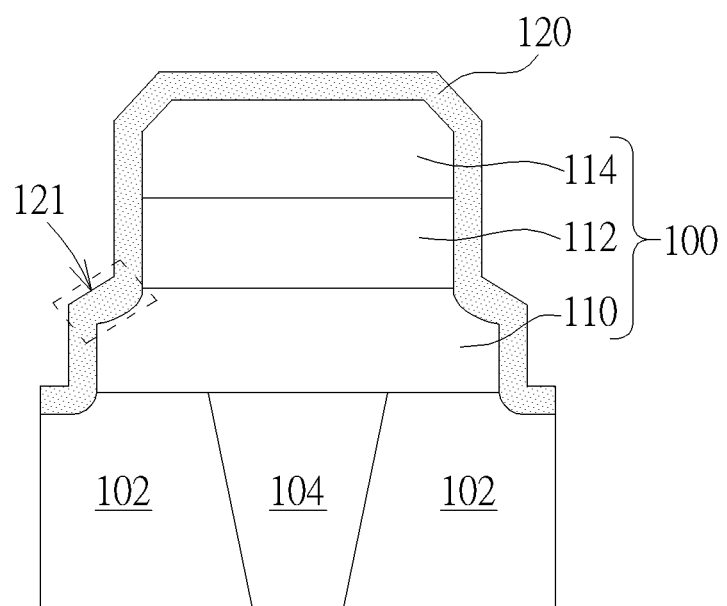

Then, as shown in FIG. 2, after the resistance random access memory 100 is formed, a cap layer 120 is formed on the surface of the resistance random access memory 100, and the material of the cap layer 120 is, for example, silicon nitride. In addition, when the cap layer 120 is formed on the surface of the recessed notch 119, the cap layer 120 fills in the recessed notch 119, and an inclined cap layer 121 is formed beside the resistance conversion layer 112 of the resistance random access memory 100.

After the production of a conventional resistance random access memory is completed, the produced RRAM will be initialized first. This process is called "forming". In the forming process, bias voltage is applied to the RRAM. When the electric field exceeds the critical value, the dielectric layer will collapse, and the dielectric layer will change from high resistance to low resistance. The phenomenon of changing resistance state occurs after forming, if the process from high resistance state to low resistance state is called "set", on the contrary, the process from low resistance state to high resistance state is called "reset". After the above forming step is completed, the applicant found that the stress of the cap layer covering the RRAM body will also change, in which the cap layer in the upper half of the RRAM (e.g., above the horizontal midline of the RRAM layer) tends to show compressive stress, while the cap layer in the lower half of the RRAM (e.g., below the horizontal midline of the RRAM layer) tends to show tensile stress. The reason for this phenomenon may be that the lattice arrangement of the cap layer changes due to the migration of oxygen atoms in the process of forming step.

The applicant found that if the stress of the cap layer covering the RRAM body is actively adjusted before the forming step, the energy required for the Forming step may be reduced, and the characteristics of the RRAM can be finely adjusted by adjusting the stress of the cap layer (such as increasing the migration rate of oxygen atoms, etc.).

Figure 3:
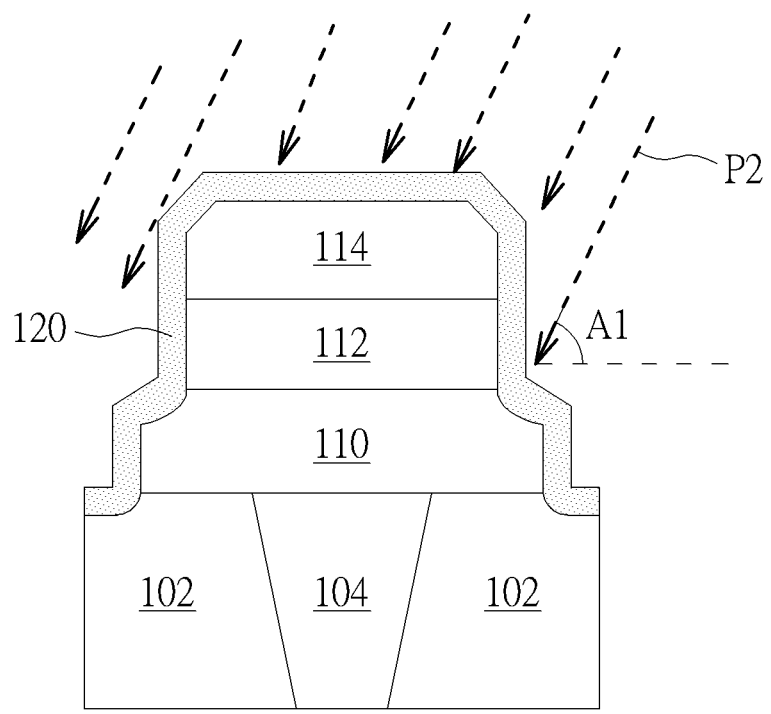
Figure 4:
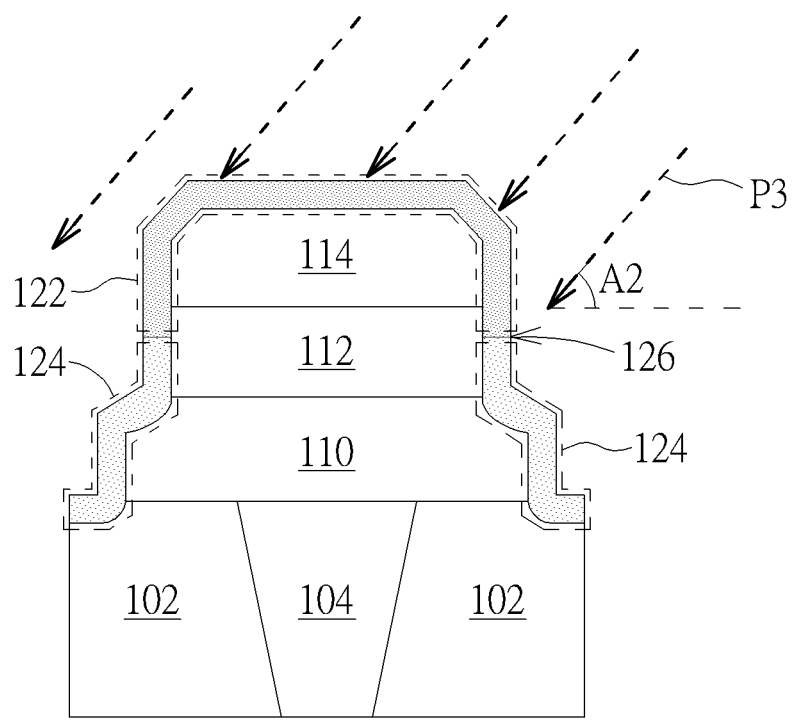

In order to achieve the above purpose, after forming the cap layer 120 covering the resistive random access memory 100, as shown in FIG. 3-4, the cap layer 120 is subjected to ion doping steps for more than two times, wherein the two ion doping steps dope the cap layer 120 at different angles, dope different regions of the cap layer with different kinds of ions, and form a stress gradient in the cap layer 120, that is, the stress gradually varies with the position.

More specifically, taking this embodiment as an example, in FIG. 3, the cap layer 120 is first subjected to a first ion doping step P2, the ions doped in the first ion doping step P2 are boron ions, and the ions are doped toward the capping layer 120 in the direction that the included angle with the horizontal plane is a first angle A1. The angle between the first angle A1 and the horizontal plane (for example, the x direction) is preferably greater than 60 degrees. As the size of the boron ions is smaller than the lattice of other atoms (such as nitrogen atoms and silicon atoms) inside the capping layer 120, the capping layer 120 presents tensile stress. In addition, it is worth noting that the inclined cap layer 121 can help collect more doped ions during the first ion doping step P2, so that the stress change in the region next to the resistance conversion layer 112 of the resistance random access memory 100 will be more obvious.

Then, as shown in FIG. 4, a second ion doping step P3 is performed on the cap layer 120. the ions doped in the second ion doping step P3 are, for example, phosphorus, argon, germanium plasma, and ion doping is performed toward the cap layer 120 in the direction that the included angle with the horizontal direction (x axis) is a second angle A2. In the present invention, the first angle A1 is different from the second angle A2, and the first angle A1 is preferably larger than the second angle A2. In this embodiment, the included angle between the second angle A2 and the horizontal plane (for example, the x direction) is preferably less than 45 degrees. Due to the large size of the phosphorus ions, the lattice of other atoms (nitrogen atoms and silicon atoms) inside the cap layer 120 will be squeezed, resulting in the pressure stress of the cap layer 120. The second ion doping step P3 mainly aims ation doping the upper half 122 of the cap layer 120 (for example, the part above the horizontal centerline of the resistance conversion layer 112), so after the second ion doping step P3, the upper half of the cap layer 120 will be converted into pressure stress, while the lower half 124 of the cap layer 120 (for example, the part below the horizontal centerline of the resistance conversion layer 112) may still maintain tension stress. In this embodiment, the cap layer 120 has an upper half 122 and a lower half 124 with different stress combinations, for example, the upper half 122 contains pressure stress and the lower half 124 contains tension stress; or the upper half 122 contains a larger pressure stress, and the lower half 124 contains a smaller pressure stress. In addition, there is an interface 126 between the upper half 122 and the lower half 124, and the interface 126 overlaps with the resistance conversion layer 122 in the horizontal direction (x direction).

Figure 5:
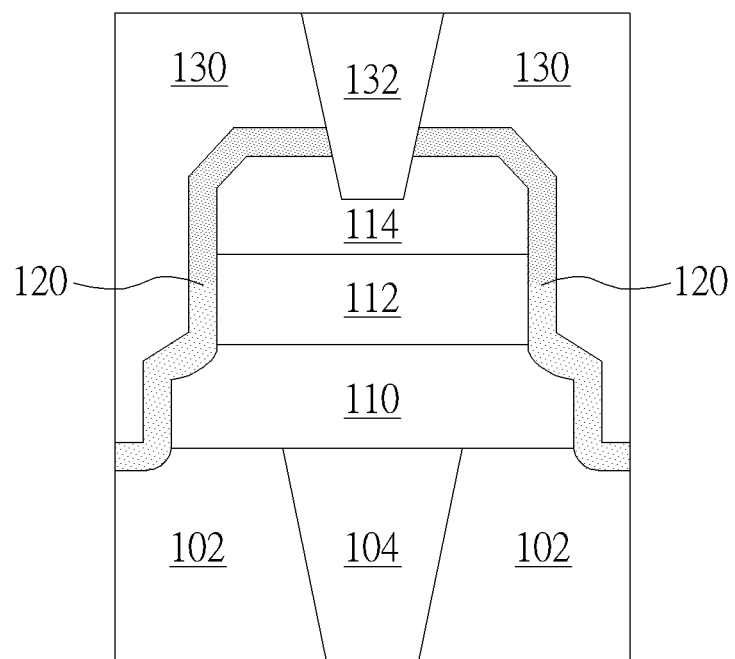

Referring to FIG. 5, a dielectric layer 130 is formed to cover the resistive random access memory 100 and the cap layer 120. The dielectric layer 130 is, for example, an ultra low-k dielectric material, and its dielectric constant is preferably lower than 2.9, but is not limited to this. Generally, the commonly used ULK materials may include, but are not limited to, Black Diamond (carbon-doped silicon oxide material with low dielectric coefficient), MSQ (methylsilsesquioxane), porous SiLK (a low dielectric coefficient material developed by Dow Chemical), etc. Then, an opening (not shown) is formed in the dielectric layer 130, and the opening is filled with a conductive material (not shown) and then planarized to form a contact structure 132 in the opening, the contact structure 132 is electrically connected with the upper electrode 114 of the resistive random access memory 100. The contact structure 132 may comprise a conductive material, such as tungsten, cobalt, copper and aluminum.

Therefore, referring to FIGS. 1-5 above, the present invention provides a semiconductor structure and a manufacturing method thereof.

According to an embodiment of the present invention, a semiconductor structure is provided, which includes a substrate (the dielectric layer 102), a resistive random access memory 100 on the substrate, an upper electrode 114, a lower electrode 110, a resistance conversion layer 112 between the upper electrode 114 and the lower electrode 112, and a cap layer 120 covering the outside of the resistive random access memory 100, the cap layer 120 has an upper half 122 and a lower half 124, and the upper half 122 and the lower half 124 contain different stresses.

According to an embodiment of the present invention, a method for forming a semiconductor structure is provided, which includes providing a substrate (dielectric layer 102), forming a resistance random access memory 100 on the substrate, wherein the resistance random access memory comprises an upper electrode 114, a lower electrode 110, a resistance conversion layer 112 between the upper electrode 114 and the lower electrode 110, and forming a cap layer 120, covering the outside of the resistance random access memory 100, the cap layer 120 has an upper half 122 and a lower half 124, and the upper half 122 and the lower half 124 contain different stresses.

In some embodiments of the present invention, the upper half 122 contains pressure stress and the lower half 124 contains tension stress.

In some embodiments of the present invention, the upper half 122 contains a larger pressure stress and the lower half 124 contains a smaller pressure stress.

In some embodiments of the present invention, a horizontal width W1 of the upper electrode is smaller than a horizontal width W2 of the lower electrode.

In some embodiments of the present invention, an interface 126 is included disposed the upper half 122 and the lower half 124, and the interface 126 overlaps with the resistance conversion layer 112 of the resistance random access memory 100 in a horizontal direction (X axis).

In some embodiments of the present invention, the material of the cap layer 120 includes silicon nitride.

In some embodiments of the present invention, the lower half 124 contains first ions, wherein the first ions contain boron ions.

In some embodiments of the present invention, the upper half 122 includes second ions, wherein the second ions include phosphorus ions, germanium ions or argon ions.

In some embodiments of the present invention, after the cap layer 120 is formed, a first ion doping step P2 and a second ion doping step P3 are further performed to dope the cap layer 120 with different ions.

In some embodiments of the present invention, when the first ion doping step P2 and the second ion doping step P3 are performed, the doping angle of the first ion doping step P2 and the doping angle of the second ion doping step P3 to the capping layer 120 are different (the first angle A1 and the second angle A2, respectively).

In some embodiments of the present invention, before the cap layer 120 is formed, a partial etching step P1 is further performed to form a recessed notch 119 between the resistance conversion layer 112 and the lower electrode 110.

In summary, the present invention is characterized in that before the forming step, ion doping is carried out on the cap layer covered outside the resistance random access memory to form a stress gradient inside the cap layer (that is, the stress gradually changes with different positions), so as to meet the lattice arrangement required by the forming step, reduce the energy required by the subsequent forming step, accelerate the carrier migration rate of the resistance random access memory and improve the quality of the resistance random access memory.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate;
   a resistive random access memory (RRAM) located on the substrate, the resistive random access memory comprises an upper electrode, a lower electrode and a resistance conversion layer located between the upper electrode and the lower electrode; and
   a cap layer covering an outside of the resistance random access memory, wherein the cap layer has an upper half and a lower half, and the upper half and the lower half contain different stresses.

2. The semiconductor structure according to claim 1, wherein the upper half contains pressure stress and the lower half contains tension stress.

3. The semiconductor structure according to claim 1, wherein the upper half contains a larger pressure stress and the lower half contains a smaller pressure stress.

4. The semiconductor structure according to claim 1, wherein a horizontal width of the upper electrode is smaller than a horizontal width of the lower electrode.

5. The semiconductor structure according to claim 1, wherein an interface is disposed between the upper half and the lower half, and the interface overlaps with the resistance conversion layer of the resistance random access memory in a horizontal direction.

6. The semiconductor structure according to claim 1, wherein the material of the cap layer comprises silicon nitride.

7. The semiconductor structure according to claim 6, wherein the lower half contains first ions, wherein the first ions contain boron ions.

8. The semiconductor structure according to claim 6, wherein the upper half comprises second ions, wherein the second ions comprise phosphorus ions, germanium ions or argon ions.

* * * * *